United States Patent [19]

Weber

[11] 4,403,332

[45] Sep. 6, 1983

[54] SIGNAL LEVEL TO PULSE RATE CONVERSION METHOD AND APPARATUS

[76] Inventor: Harold J. Weber, P.O. Box 315, 20 Whitney Dr., Sherborn, Mass. 01770

[21] Appl. No.: 224,392

[22] Filed: Jan. 12, 1981

[51] Int. Cl.³ .............................................. H03K 11/00
[52] U.S. Cl. .................................. 375/94; 340/870.21
[58] Field of Search ........................ 375/24, 37, 75, 94, 375/95, 96; 455/600, 617, 619; 370/116; 332/1; 328/115, 157; 329/107, 109; 340/825.57, 825.64, 870.19, 870.2, 870.21, 347 AD

[56] References Cited

U.S. PATENT DOCUMENTS

| | | | |
|---|---|---|---|
| 3,229,272 | 1/1966 | Cohen et al. | 340/870.21 |
| 3,351,931 | 11/1967 | Lytle | 340/347 AD |
| 4,119,948 | 10/1978 | Ward et al. | 340/870.19 |
| 4,147,973 | 4/1979 | Weber | 375/42 |

*Primary Examiner*—Benedict V. Safourek

[57] ABSTRACT

A continuous, momently constant amplitude signal is received through a lossy transmission medium and adapted to produce a distinct step-like series of pulse repetition rates therefrom which are proportional to the received signal amplitude. The relatively constant received signal is modulated into a sequence of distinctly separate amplitude steps which are level detected and adapted to produce a cyclic pulse rate proportional to the average value of the received signal. The cyclic pulse rate is employed directly to give aural or visual indication. Alternatively the cyclic pulse rate is adapted to provide a binary format signal for cooperation with a computer data bus or the like.

14 Claims, 9 Drawing Figures

SIGNAL LEVEL TO PULSE RATE CONVERSION METHOD AND APPARATUS

BACKGROUND OF INVENTION

The gist of this invention is the measurement of unknown signal levels. The unknown signal is converted into a pulse train the periodicity of which is proportional to signal strength. Usually, a more rapid pulse rate is keynote to a higher signal level.

In earlier art, an unknown signal is rectified and the resulting d.c. value is coupled with a voltage controlled oscillator. The result is a pulse signal having a periodicity which is varied relative to signal strength. Such a detector arrangement is taught by Weber in U.S. Pat. No. 4,044,299. The disadvantage is that the resultant pulse rate is only an indirect measure of signal level.

Further improvement is had in Weber U.S. Pat. No. 4,137,500 which teaches an exciter which produces a frequency dependent amplitude modulated signal which has an inherent modulation character which provides a step pattern pulse train signal which may cooperate with the translator taught in Weber U.S. Pat. No. 4,147,973. The translator is arranged so as to respond to the individual amplitude steps of the pulse train produced by the separate exciter. The result is a detector which recovers a sequence of component pulse rates, the periodicity of which is dependent on the signal level received from the exciter.

The instant invention improves upon this earlier art in that the advantage of signal value related pulse level detection, e.g. frequency dependent amplitude modulated signal detection, is provided while retaining the use of a conventional steady signal source. Therefore, pre-existing signal sources, such as ordinarilly used in telecommunications and the like, serve to provide the necessary input signal to this invention.

SUMMARY

The invention relates to the reception of a constant value signal of unknown level through a transmission medium from an external source of relatively steady signal, and adapting it into a train of pulses the momentary periodicity of which is representative of the signal level. The incoming signal is methodically modulated in amplitude by a series of step-like bursts, or pulses, having numerous lower, usually audio frequency, alternating current rates wherein each particular lower frequency component creates a train of singular pulses the duration of which each represent less than one total cycle period of the highest component frequency rate and furthermore where each said singular pulse of low frequency signal is at an absolute amplitude which is greatest for the less frequently occurring lower frequency rates and of decreasing amplitude for the increasingly more frequently occurring lower frequency rates. The said lower frequency component signals are provided by digital circuitry incorporated into the invention. The resulting sequent energy pattern produced by the multilevel modulation of the incoming signal is converted into a variable rate output pulse train through selective level detection of the modulated signal. Therefore, for a weak incoming signal only the highest amplitude and lowest recurrence rate pulses are recovered by the level detector. As the incoming signal average, or steady-state, level increases, higher recurrence rate pulses are recovered by the level detector. In general, the increase in the periodicity rate of the recovered pulses is proportional to an increase in the relative incoming signal level.

The pulse train produced by the level detector is conditioned, as by a one-shot multivibrator or the like, and used to drive a signal device or alternatively, as a source of binary data for a computer machine.

DESCRIPTION OF INVENTION

Figure 1:
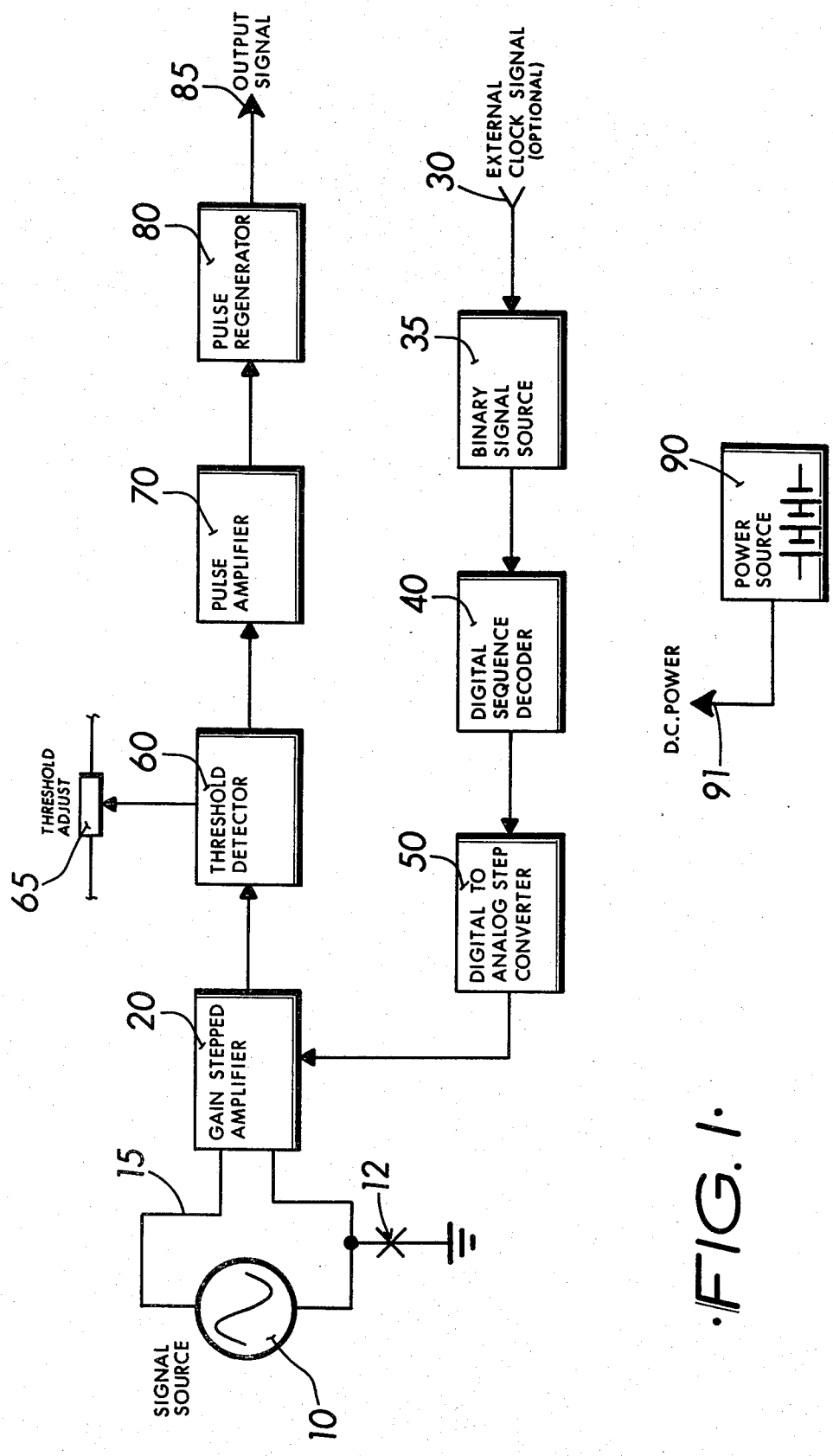
FIG. 1 Diagrammatic description of functional elements comprising the invention's essence.

The gist of my invention is depicted in FIG. 1. A signal source 10 produces a constant level stream of electric signals which couple 12, 15 to a gain stepped amplifier 20. An external train of usually audio frequency rate clock signals 30 couple with a binary signal source 35 (such as a counter) which produces a binary byte signal to drive a digital sequence decoder 40. It is the purpose of this decoder 40 to produce a plurality of binary signal pulse train values, whereby the repetition rates therebetween are harmonically decreased, whilst the duration of the pulse comprising any individual signal value is about equal to the duration of an individual component pulse of the highest frequency binary pulse train signals. The resulting pulses couple with a digital-to-analog step converter 50 which adapts the several pulse train signals into a substantially analog waveform which decreases and increases in amplitude in accord with the instant combination of the several binary signal pulse train values. This analog waveform serves to couple with a gain control input of the gain stepped amplifier 20. The result is the output produced from the amplifier, as coupled with the threshold detector 60, is caused to vary in a predetermined amplitude pattern even with a relatively constant value (albeit unknown) electric signal inputted thereto. The gain stepped amplifier 20 acts as a converter, whereby the relatively constant electromagnetic signal coupled thereto is modulated by the composite signal to produce a converted electromagnetic signal therefrom. The converted signal couples with a threshold detector 60, which includes a threshold adjustment 65. The threshold adjustment predetermines the effective value where the inputted converted electromagnetic signal exceeds the detector threshold level and produces a first level output, or else shortfalls the detector threshold level and produces a second level output.

The detector output is a pulse signal which is usually amplified 70 and coupled with a pulse regenerator 80. It is the purpose of the regenerator to normalize the duration of any pulses produced by the detector 60 into a train of pulses having a predetermined envelope waveshape. A source of d.c. power 90 provides d.c. power for operation of the various circuit elements.

Figure 2:
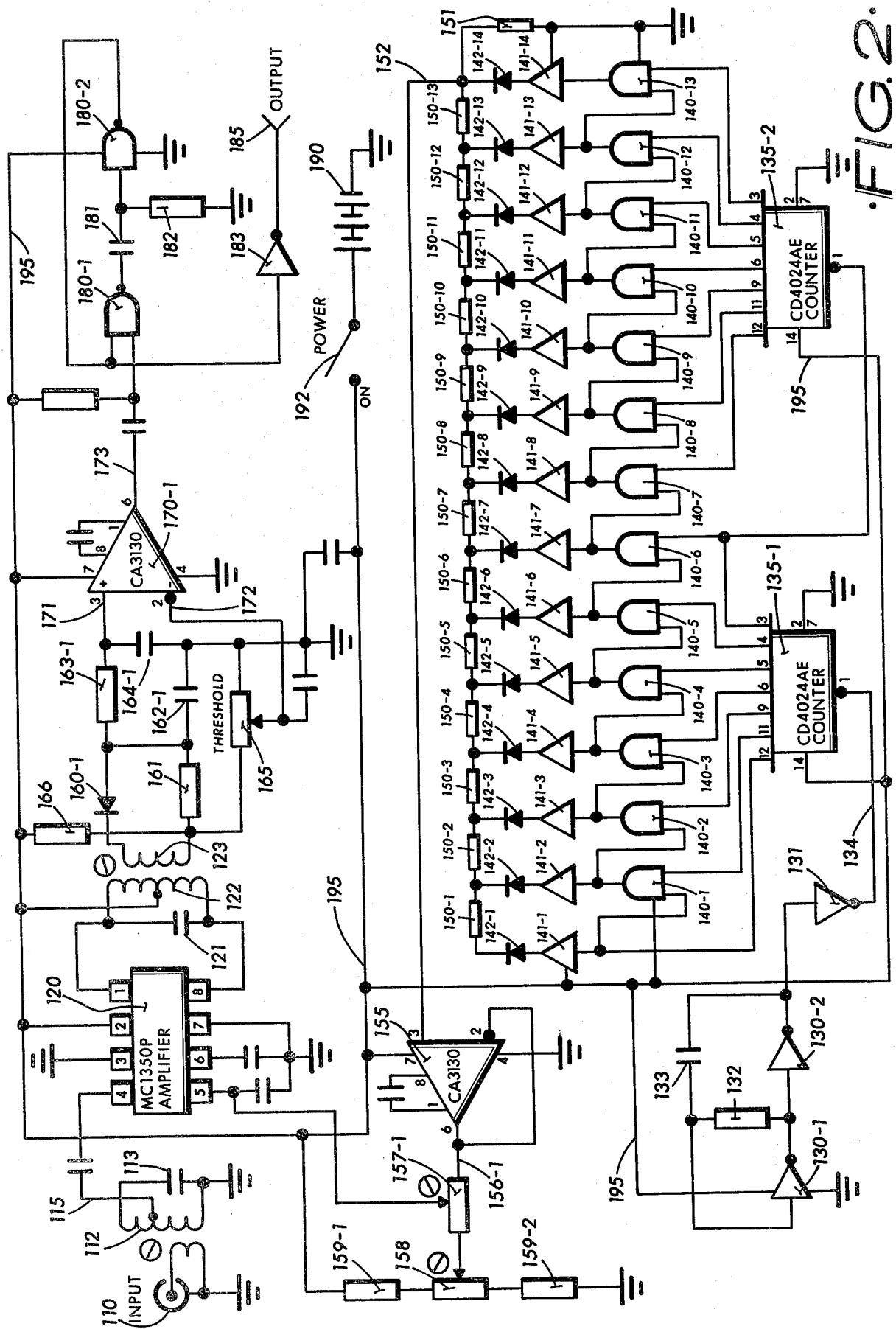
FIG. 2 Electrical diagram for a preferred embodiment for apparatus receiving radio frequency incoming signals.

The circuit for a preferred embodiment is given in FIG. 2. The input 110 couples with a source of a.c. signal. In the example, the signal has a nominal frequency of 310 kilohertz and is coupled through a resonant transformer 112, brought to resonance by a capacitor 113 in combination with the winding inductance. A tap 115 on the winding couples to the input, pin 4, of a Motorola MC1350P amplifier 120. The amplifier outputs, pins 1 and 8, couple with transformer winding 122, brought to 310 kilohertz resonance with capacitor 121. The secondary 123 produces an a.c. signal which couples with a diode 160-1 for rectification, e.g. detection. Resistor 161 serves as the detector load, whilst capacitor 162-1 effects high frequency filtering. Resistor 166 together with potentiometer 165 provide a median voltage about half that of the value on the $+V_c$ line 195. Therefore the d.c. value coupled through filter resistor 163-1 on the operational amplifier 170-1 input 171 is about the same mid-value, enabling satisfactory single-ended power supply operation of the amplifier 170-1. The tap on potentiometer 165 provides variation of the d.c. bias on the amplifier input 172. When the tap is most near the juncture of resistor 165 with 166, maximum sensitivity is achieved. The amplifier 170-1 operates without feedback, in a comparator mode. Therefore when the incoming signal is rectified by diode 160-1, a negative signal couples with the input 171 which may serve to abruptly drive the output 173 from a HIGH state, near $+V_c$ level, to near ground. This negative transition couples with NAND gate 180-1, such as an R.C.A. type CD-4011 integrated circuit, which is combined with a second gate 180-2 to provide a one-shot, monostable multivibrator effect, triggered by the negative going transition. The pulse width, as determined by the timing capacitor 181 and resistor 182, is about 50 microseconds. The resulting pulse is amplified by an inverter 183, providing an output 185.

The invention's essence is provided by a clock oscillator comprising inverters 130-1, 130-2 together with timing elements 132, 133 which couple a clock signal 134 through inverter 131 to the input of a seven bit counter 135-1. A second counter 135-2 is cascaded with the first counter, to provide fourteen binary outputs. The arrangement of AND gates 140-1 through 140-13 provides a decoded priority based signal which further couples through buffer elements 141-1 through 141-14 (such as R.C.A. type CD-4050A) and diodes 142-1 through 142-14. These coupled binary pulses couple further with a resistor combination 150-1 through 150-13 which, together with resistor 151, produce a continuum of analog value steps on line 152 which is the greatest when a most significant bit (M.S.B.) pulse couples from diode 142-14, and least when only a least significant bit (L.S.B.) pulse couples from diode 142-1. This analog step signal 152 couples with the noninverting input of an operational amplifier, operating as a buffer with unity gain. The output 156-1 develops across potentiometer 157-1 which serves to set the maximum gain of amplifier 120, whilst the voltage tapped from potentiometer 158, in combination with resistors 159-1, 159-2 sets the minimum gain. Therefore, as the analog step voltage is produced on line 152, it serves to effectively couple with the gain control input pin 5 of the amplifier 120. The result is a step-like modulation at the output of amplifier 120 of any substantially steady level input 115 to the amplifier. This effect serves to produce a step-like relationship between the detected pulses responsive with the comparator, e.g. amplifier 170-1, input. Therefore, the interval spacing between the conditioned pulses at the output 185 will change in proportion to changes in the input 110 level.

Figure 3:
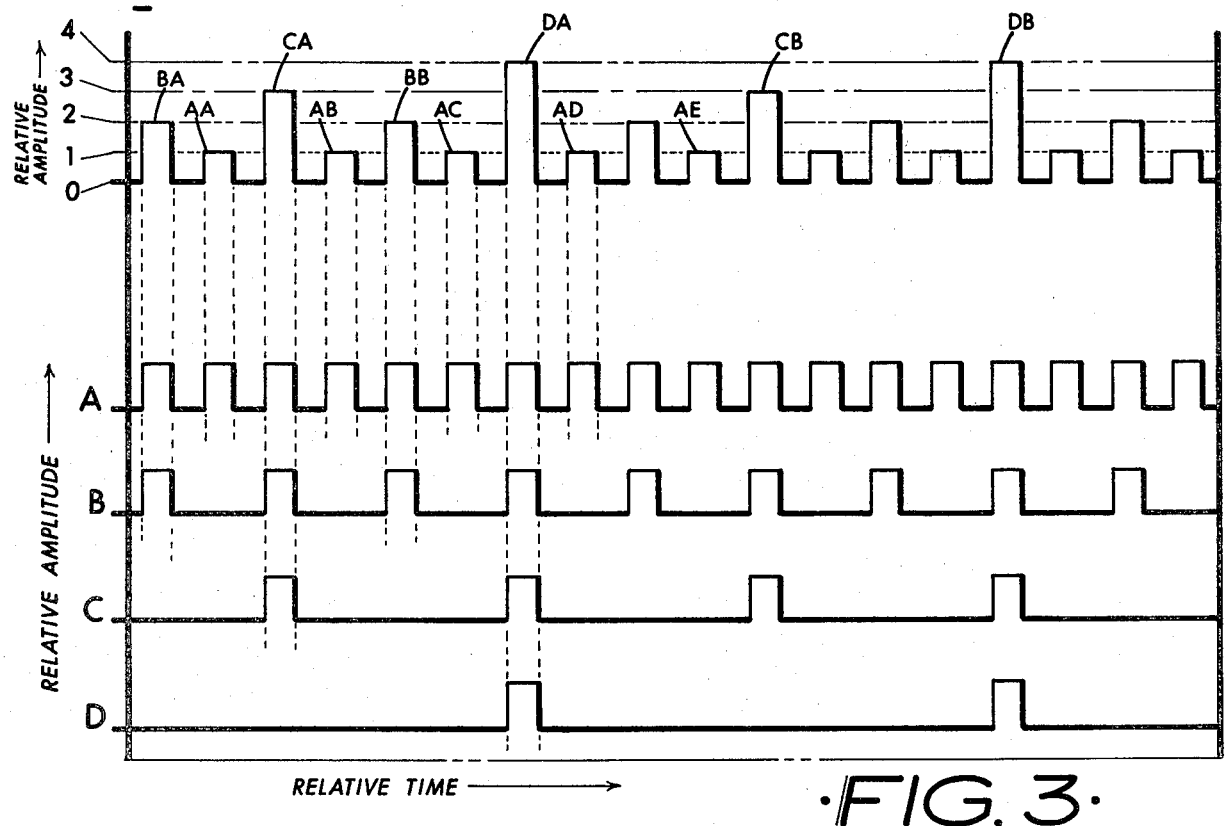
FIG. 3 Waveforms characteristic of the composite multilevel and the detected signals.

The waveforms of FIG. 3 show the gist of this varied response. The upper, amplitude variant waveforms represent the changes in detected signal at the diode 160-1 output. The most frequent pulses AA through AE have the least amplitude of "1". The "2" amplitude signals BA, BB occur half as frequent as the "1" signal. In a similar way, the "3" amplitude signals CA, CB occur half as frequent as the "2" signal. The least frequent "4" signals DA, DB occur at half the rate of the "3" signal. If the comparator 170-1 is set to respond to a "0 to 1" level, the output will appear as the highest rate pulse train A. If the input of the comparator is set for other, higher threshold levels between "1" and "4", the result will be correspondent lower repetition pulse rates B, C, or D.

Figure 4:
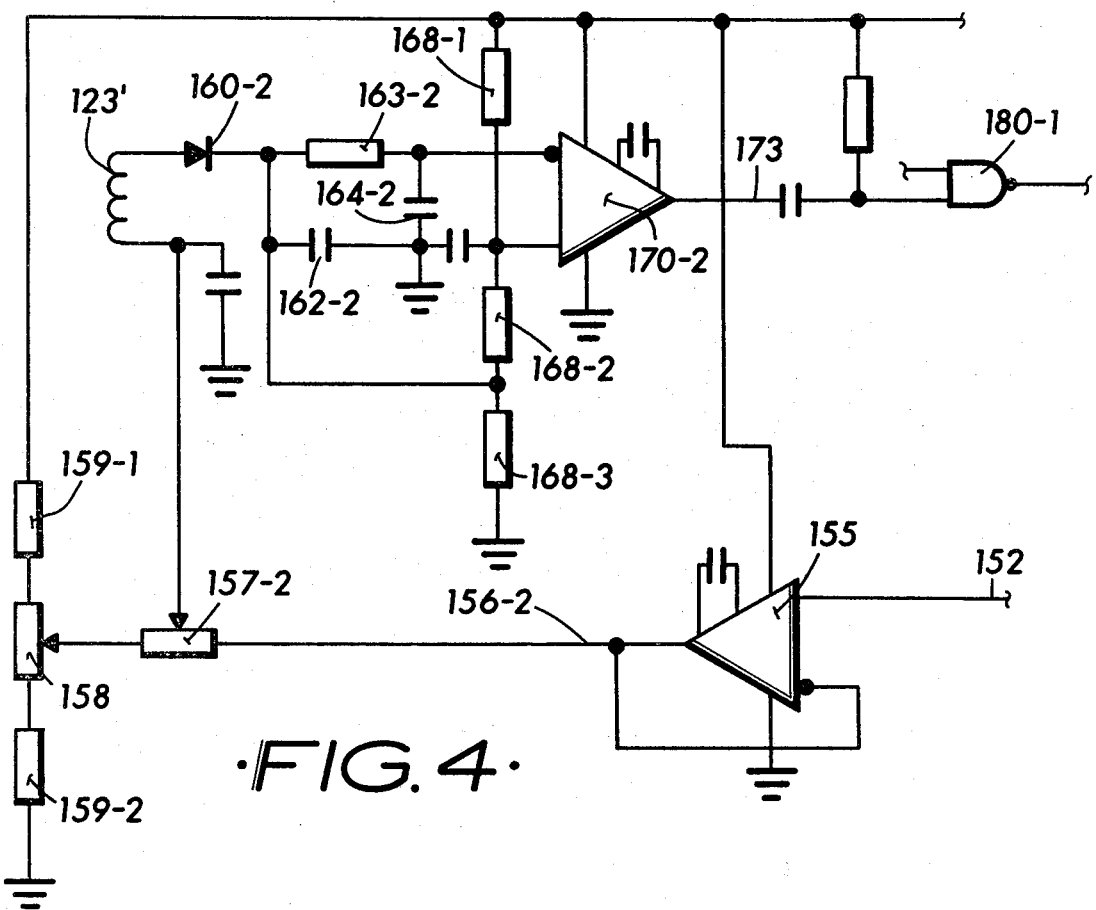
FIG. 4 Partial schematic showing post-amplification control of signal rectifier for pulse rate conversion of the average signal level.

FIG. 4 shows how the voltage follower 155 output of FIG. 2 can serve to develop a step-value analog signal at the tap of potentiometer 157-2 which serves to modulate the reverse voltage across the detector diode 160-2. As shown, the comparator 170-2 has the noninverting input biased positive. In a similar way, the inverting input is biased less positive through the tap arrangement of resistors 168-1, 168-2, 168-3. Therefore, in the presence of no signal on winding 123', the comparator output 173 is HIGH, near $+V_c$ level. When a signal appears on the winding 123', it must first overcome the modulated reverse bias imposed on the diode 160-2 junction. This arrangement allows modulation at the detector, so the amplifier 120 of FIG. 2 is usually run with a high, fixed gain level.

Figure 5:
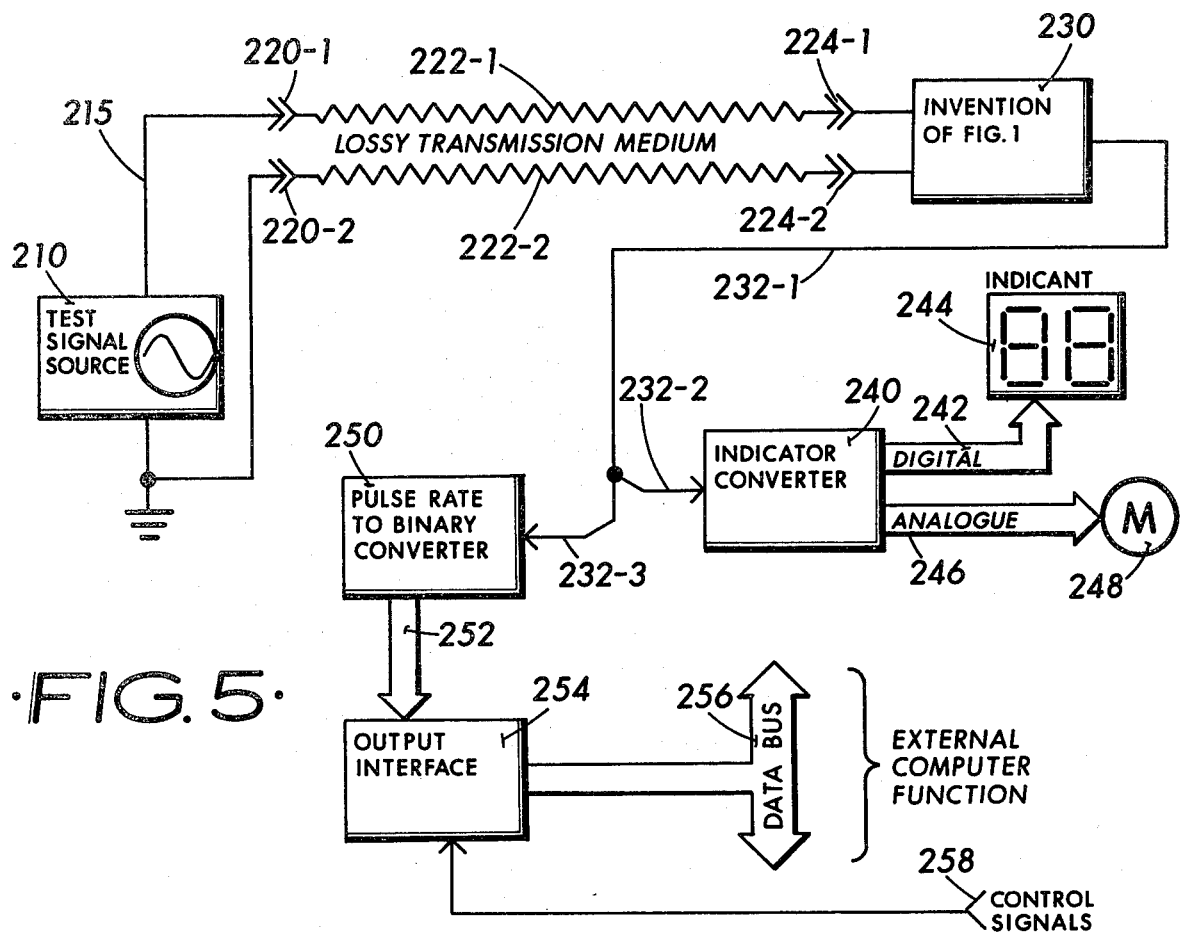
FIG. 5 Adaptation of the invention for measurement of the transmission losses between a source of steady signal and the instant apparatus.

The application of this teaching to a typical, useful end is shown in FIG. 5. A test signal source 210 produces a steady a.c. signal 215 which couples 220-1, 220-2 with a "lossy transmission medium" 222-1, 222-2. Such a medium may be a telephone transmission line, or a data coupling wire circuit. It may also be wireless, such as radio frequency energy, optical light, or audio sound pressure. The output couples 224-1, 224-2 with the translator 230 of FIG. 1, producing a pulse train signal 232-1 therefrom. The indicator converter 240 pulse counts the signal 232-2, providing a binary signal 242 which is decoded to drive an indicant 244, or else provide an analogue signal 246 to drive a galvanometer 248. The pulse signal also couples 232-3 with a pulse rate to binary converter 250 which acts to provide a binary data signal 252 to an output interface, e.g. tristate latch logic or the like, which affords couplability with a DATA BUS line 256 comprising part of an external computer function. The computer also provides control signals 258 which act to control the interface 254.

Figure 6:
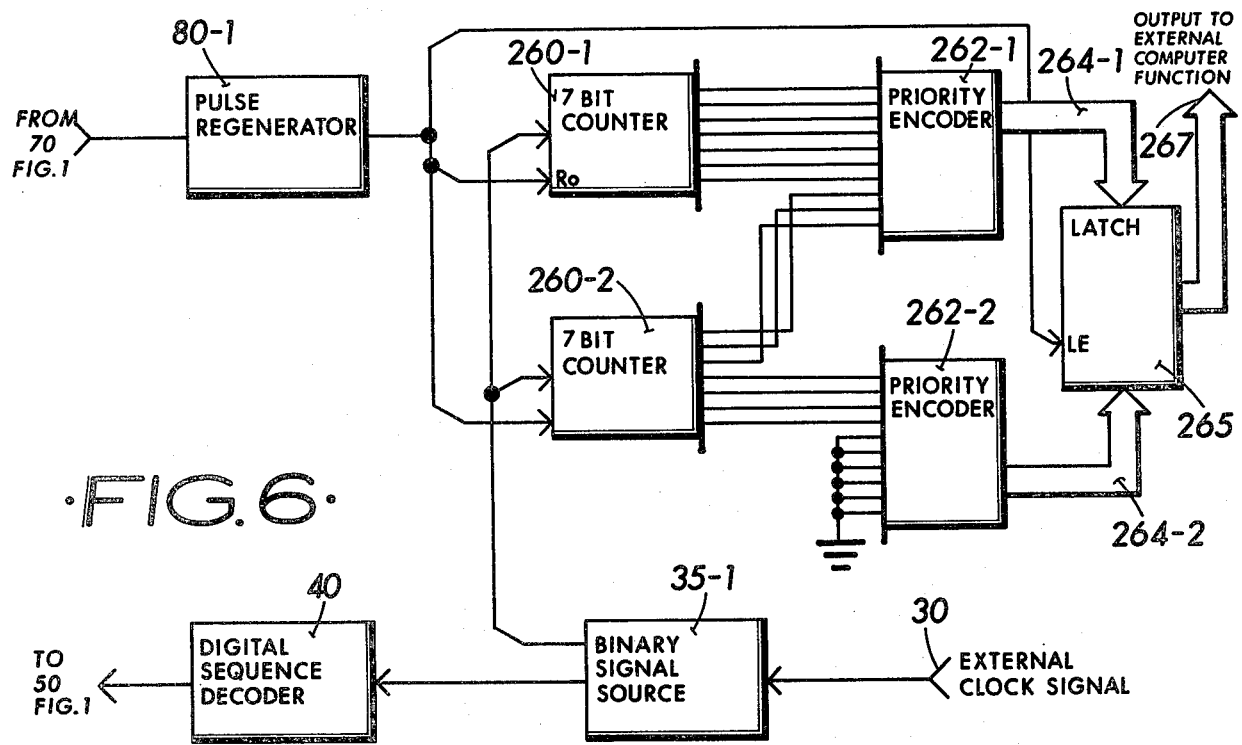
FIG. 6 Pulse rate signal to digital format data bus signal conversion adaptation of FIG. 1.

The embodiment of FIG. 6 shows the pulse regenerator 80-1, of FIG. 1 providing a pulse train signal which serves to RESET the seven bit counters 260-1, 260-2. The counters are clocked at a rate higher than the highest repetition rate component of the composite signal produced by the binary signal source 35-1. The counts advance until reset. How high the count advances is indicative of how low the recovered signal pulse is, e.g. the lowest recurrent reset pulses allow the highest count. Priority encoders 262-1, 262-2 produce binary value signals 264-1, 264-2 proportional to the count, which couple through an interface latch providing an output 267 to an external computer function.

Figure 7:
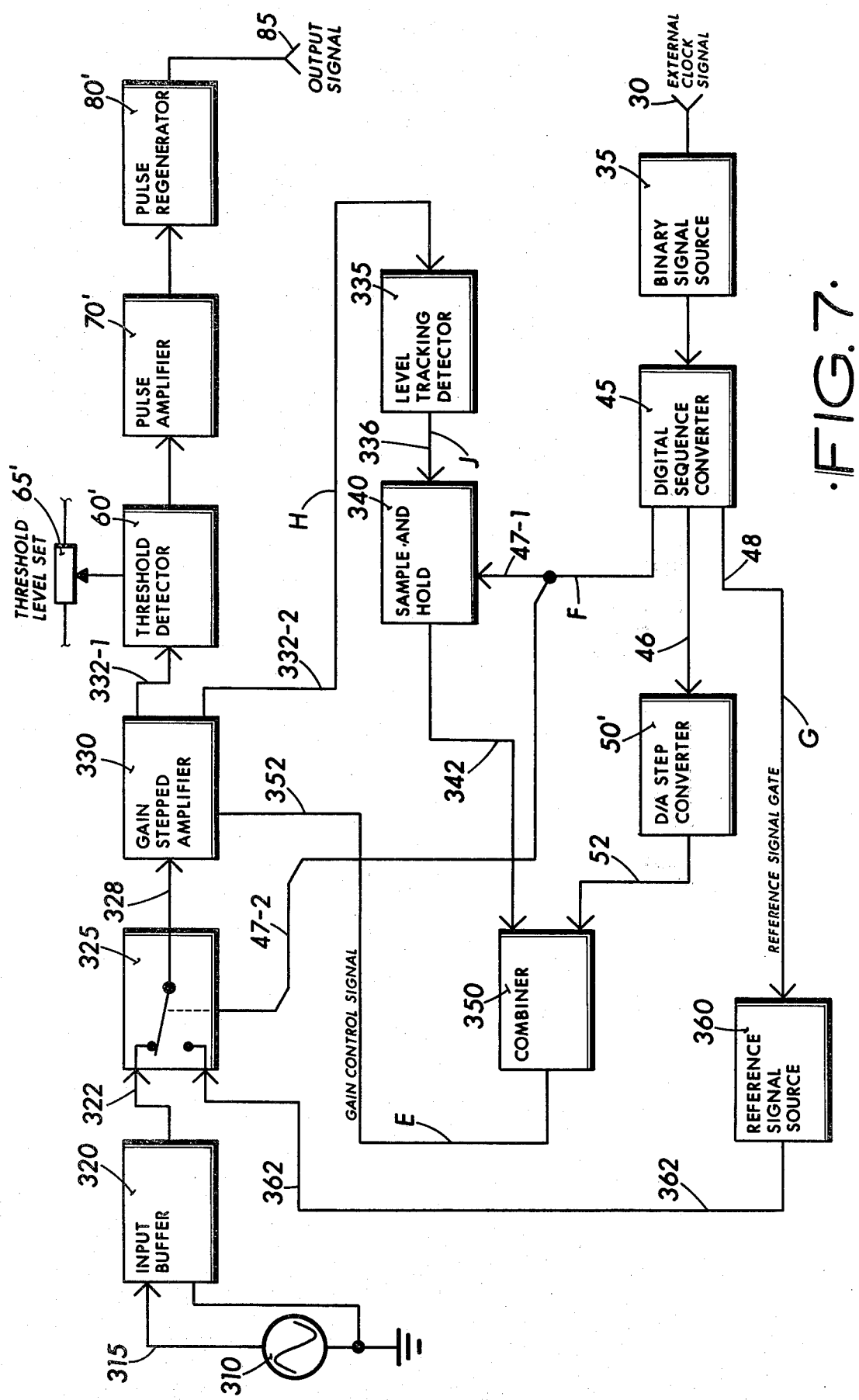
FIG. 7 Diagrammatic description of the functional elements for a preferred embodiment including automatic calibration of overall sensitivity.

A preferred embodiment providing an automatic sensitivity adjustment appears in FIG. 7. The effect is to provide accurate automatic calibration of the overall translator response sensitivity. The signal source 310 which is to be measured couples 315 with a constant, fixed gain, input buffer or amplifier 320. The resulting signal 322 couples with a highspeed analog switch 325. The output of the switch 328 couples with a gain stepped amplifier, e.g. modulator, 330 which provides a stepped, analog value signal at each output 332-1, 332-2 which is proportional to the input signal 315. The signal on one output 332-1 couples with the threshold detector 60', which together with the pulse amplifier 70' and pulse regenerator 80', function as described for FIG. 1 to provide an output signal 85.

Figure 8:
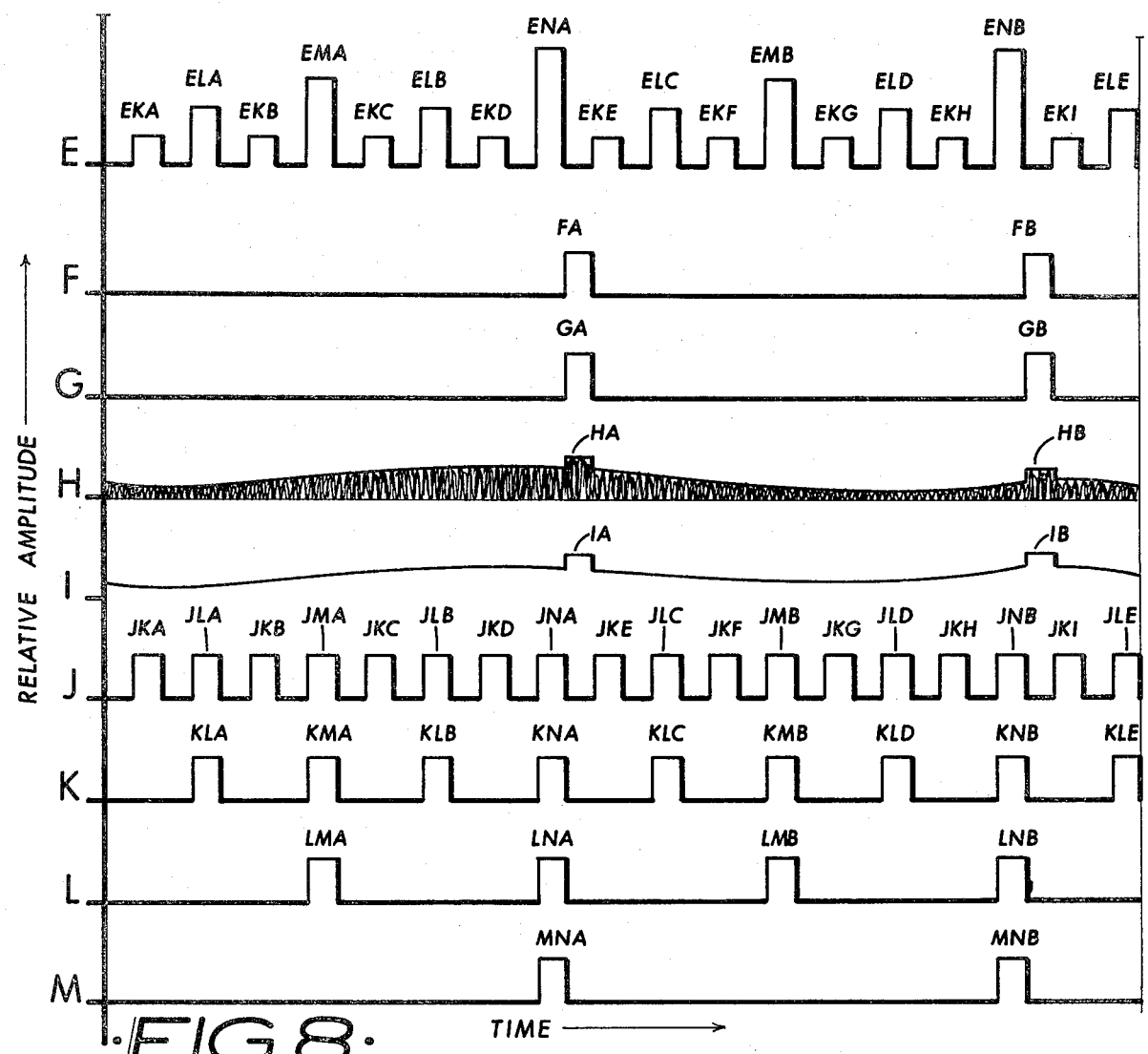
FIG. 8 Waveforms characteristic of the automatic calibration functions.

The other output 332-2 couples with a level tracking detector 335 which is usually a peak detector or rectifier producing a signal 336 therefrom which, at any instant, is proportional to the corresponding level component of the coupled step signal. The sample-and-hold (SH) 340 serves to detect or "hold" the value present from the detector 335 at the instant it is keyed 47-1 by the digital sequence converter 45. Referring to FIG. 8, the waveform E shows the stepped gain control signal coupled with the gain stepped amplifier 330 on line 352. Signal F is the key signal for the sample-and-hold, and is in time interleaved between two of the E pulses. For example, pulse FA occurs in the time frame between the end of pulse ENA and the start of EKE, whilst pulse FB occurs between pulse ENB and EKI. The G pulse is synchronous with the F pulse, but it is preferably a little wider, e.g. it starts earlier and ends later than the F pulse. The F pulse also controls 47-2 the input selector 325. When the F pulse, and the concurrent G pulse, are enabled the reference signal source 360 produces a local signal which is similar to the usual input signal 310 character, except that the absolute amplitude is precisely leveled. This predictable, constant value local signal couples 362 through the selector 325 into the amplifier 330. The result is the detector 335 provides a rectified level proportional to the reference signal which is sampled 340 to provide a combiner 350 with a summing signal to be functionally combined with the step-controlled signal 52, thereby compensating the net average gain of the amplifier 330 between the F pulse recalibration samples. The H pulse shows the predetected signal, while the I waveform is the postdetected reference signal. The pulses J, K, L, and M depict four decoded, threshold detected signals produced at the output 85.

Figure 9:
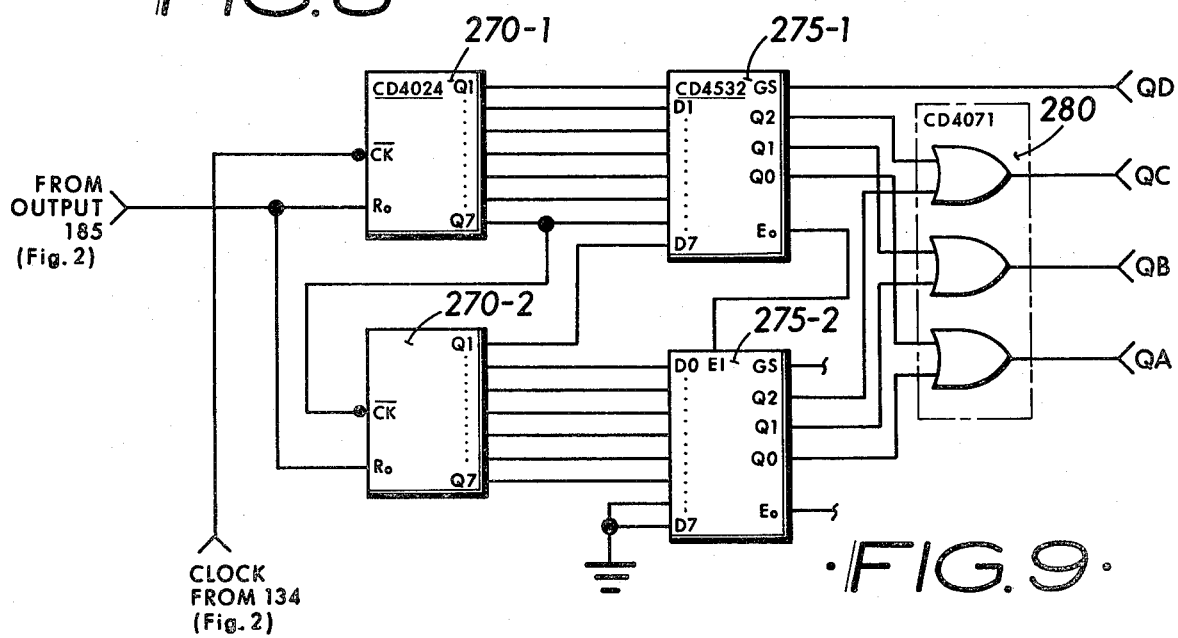
FIG. 9 A particular embodiment for pulse rate to digital data word conversion.

The subcircuit of FIG. 9 gives illustration of a particular hookup for the rate converter part of FIG. 7 in combination with the overall circuit of FIG. 2. The output signal 185 couples with the RESET input of each seven bit counter 270-1, 270-2 which are cascaded. The CLOCK signal 134 (from the inverter 131 output in FIG. 2) advances the two counters as far through the $2^{14}$ binary states as allowed between reset pulses on line 185. The priority encoders 275-1, 275-2 in combination with the OR gates 280 provide a four bit binary output QA, QB, QC, and QD which is, at the very instant of reset, of a byte weight indicative of the allowed counter state between resets. The binary byte signal weight is proportional to the unknown level input signal coupled from the signal source.

While I have shown and described a preferred method for the essence of my invention, together with a preferred embodiment for the practice thereof, it will be readily apparent to those skilled in the art that many other changes and adaptations may be made in either the method or the embodiments without departing from the spirit of my invention in its broader aspects.

What I claim is:

1. Translator method effective for:
   a. receiving a first signal coupled from a separate unmodulated source, said first signal having a received value effectively proportional to the signal level of the source and the efficacy of coupling between the said source and translator;
   b. producing therefrom a repetative pattern variate amplitude second signal pulse train having at least several different instant values substantially proportional to said first signal value;
   c. predetermining said pattern to effectively comprise a combination of several pulse trains each having different and preferably synchronous recurrence frequencies, wherein the relatively lower recurrence frequency pulses comprising said combination obtain greater effective signal amplitude;
   d. predetermining a threshold value;
   e. detecting second signal pulses exceeding said threshold level; and,
   f. producing a pulsed third signal having a frequency proportional to the frequency of the said second signal pulses that exceed said threshold and are detected.

2. Translator method of claim 1 effected through the combination of:
   a. methodically modulating the level of the said received first signal thereby producing the said second signal to be variated in amplitude steps by numerous concurrent control pulse train signals, wherein each component control pulse signal frequency rate effects an orderly repetitous succession of singular signal step values proportional to said first signal value and wherein the duration of each step represents less than one total cycle period of the highest of the component control pulse train signal rates, whereupon the magnitude of each singular signal step value is usually at an absolute amplitude which is greatest for the less frequently occuring component control pulse train rates and least amplitude for the most frequently occuring component pulse rates;
   b. selectively detecting the instant level of the resultant step modulated said second signal at any one of several predetermined values; whereby the third signal is repetitively produced as a succession of pulses having a first value when the said predetermined value is effectively greater than the said second signal value, and conversely a second value when the said second signal value is effectively greater than the said predetermined value;
   c. adapting said third signal to provide an indicative signal.

3. Translator method of claim 1 wherein said first signal is an alternating current signal having a periodicity rate substantially higher than the highest said first frequency pulse train rate.

4. Translator method of claim 1 wherein said first signal is a substantially direct current signal.

5. Translator apparatus for adapting the amplitude value of an electromagnetic signal into a repetative pulse train electric signal having a periodicity rate value proportional to said amplitude, including in combination:
   a. a substantially separate source of electromagnetic signal;
   b. a digital sequency source means producing several series of pulse train signal having different intrinsic periodicity rates therebetween while having harmonic relationship thereamongst;
   c. a digital-to-analog step converter means coupled with said digital sequence source, effective to receive pulse train signals therefrom and produce a composite signal comprising a repetitious continuum of various amplitude value steps, each constituent step of which has a predetermined amplitude value proportional to the signal pulse series comprising the lowest frequency pulse train instantly produced by the said digital sequence source;
   d. amplitude converter means having at least a signal input coupled with said electromagnetic signal source, a control input coupled with said composite signal, and a converted output therefrom; operative to combine, as by modulation, said electromagnetic signal with said composite signal so as to produce a repetative sequence comprising bursts of converted electromagnetic signal having various values of predetermined amplitude; and further includes a level detector means responsive with the value of the said converted electromagnetic signals to repetatively produce at least a first determinative signal therefrom when said converted electromagnetic signal exceeds a predetermined value and a second determinative signal therefrom when said converted electromagnetic signal shortfalls a predetermined value;
   e. output terminal means coupled with said detector means, adapted for bringing forth said first and second determinative signals; and,
   f. power supply means effectively coupled with the several said means comprising the said apparatus.

6. Translator apparatus of claim 5 wherein said electromagnetic signal is a radio frequency signal selected to have a predetermined nominal frequency between about ten kilohertz and one gigahertz.

7. Translator apparatus of claim 5 wherein the combining of the said electromagnetic signal and the said composite signal is effected through means modifying the amplitude of the said electromagnetic signal prior to coupling with said level detector means.

8. Translator apparatus of claim 5 wherein the intrinsic detector threshold level of the said level detector is coupled with the said composite signal and caused thereby to be repetatively modified whilst the said electromagnetic signal is coupled with the detector as a substantially constant value.

9. Translator apparatus of claim 5 wherein a monostable oscillatory element means is coupled with the said output terminal means for receiving at least one of said determinative signals therefrom, operative therewith to adapt said determinative signal, which may comprise component pulses of various durations, into a continuum of equipotent pulses having a relatively constant duration.

10. Translator apparatus of claim 5 wherein said source of electromagnetic signal is coupled with said amplitude converter through a lossy transmission medium having a various, usually unknown, value of attenuation relative to the electromagnetic signal passing therethrough.

11. Translator apparatus of claim 10 wherein said lossy transmission medium is a wire communications line, including that type utilized for telephone communications and digital data transmission.

12. Translator apparatus of claim 5 wherein said determinative signal couples with a binary data converter means operative to produce a digital data bus signal therefrom.

13. Translator apparatus of claim 5 wherein said determinative signals couple with an indicator converter means effective to adapt the said determinative signals into sensory response indications.

14. Translator apparatus of claim 5 wherein the average gain through the amplitude converter is maintained relatively constant through the effect of sample-and-hold means, whereby the maximum amplitude of the least periodic bursts of converted electromagnetic signal extracted by a level tracking detector are sampled and adapted as an average gain level signal, with the composite signal acting in combination therewith to repetatively modulate at least part of the said electromagnetic signal with each change in the composite signal component pulse values coupled through a gain stepped amplifier means, whereas the average gain therethrough changes, at the most, with the amplitude determination derived from each least periodic composite signal component pulse.

* * * * *